(12) United States Patent
Ulyashin et al.

(10) Patent No.: US 8,916,768 B2
(45) Date of Patent: Dec. 23, 2014

(54) SURFACE PASSIVATION OF SILICON BASED WAFERS

(75) Inventors: Alexander Ulyashin, Oslo (NO);
Andreas Bentzen, Oslo (NO); Bengt Svensson, Oslo (NO); Arve Holt, Leirsund (NO); Erik Sauar, Oslo (NO)

(73) Assignees: Rec Solar Pte. Ltd., Singapore (SG);
Universitetet I Oslo, Oslo (NO);
Institutt for Energiteknikk, Kjeller (NO)

( * ) Notice: Subject to any disclaimer, the term of this patent is extended or adjusted under 35 U.S.C. 154(b) by 1134 days.

(21) Appl. No.: 11/918,325

(22) PCT Filed: Apr. 12, 2006

(86) PCT No.: PCT/NO2006/000139
§ 371 (c)(1),
(2), (4) Date: Mar. 4, 2008

(87) PCT Pub. No.: WO2006/110048
PCT Pub. Date: Oct. 19, 2006

(65) Prior Publication Data
US 2009/0056800 A1 Mar. 5, 2009

Related U.S. Application Data

(60) Provisional application No. 60/671,081, filed on Apr. 14, 2005.

(51) Int. Cl.
*H01L 31/00* (2006.01)
*H01L 21/31* (2006.01)
*H01L 21/469* (2006.01)
*H01L 31/18* (2006.01)
*H01L 31/0216* (2014.01)

(52) U.S. Cl.
CPC ...... *H01L 31/02167* (2013.01); *H01L 31/1868* (2013.01); *H01L 31/1864* (2013.01); *Y02E 10/50* (2013.01)
USPC .... 136/256; 438/763; 257/640; 257/E31.119; 257/E21.24; 257/E23.002

(58) Field of Classification Search
CPC ............ H01L 31/1868; H01L 31/1864; H01L 31/02167; Y02E 10/50
USPC ........... 136/256; 438/763; 257/640, E31.119, 257/E21.24, E23.002
See application file for complete search history.

(56) References Cited

U.S. PATENT DOCUMENTS 4,254,426 A    3/1981  Pankove
4,681,657 A *  7/1987  Hwang et al. ................. 438/753
(Continued)

FOREIGN PATENT DOCUMENTS

EP        1 475 844 A    11/2004
KR      2002-0018204     4/2002
(Continued)

OTHER PUBLICATIONS
Machine Translation of Kim, KR 2003-0079265.*
(Continued)

*Primary Examiner* — Tamir Ayad
(74) *Attorney, Agent, or Firm* — Birch, Stewart, Kolasch & Birch, LLP

(57) ABSTRACT

The surface recombination velocity of a silicon sample is reduced by deposition of a thin hydrogenated amorphous silicon or hydrogenated amorphous silicon carbide film, followed by deposition of a thin hydrogenated silicon nitride film. The surface recombination velocity is further decreased by a subsequent anneal. Silicon solar cell structures using this new method for efficient reduction of the surface recombination velocity is claimed.

10 Claims, 5 Drawing Sheets

(56) References Cited

U.S. PATENT DOCUMENTS

Figure 2A:
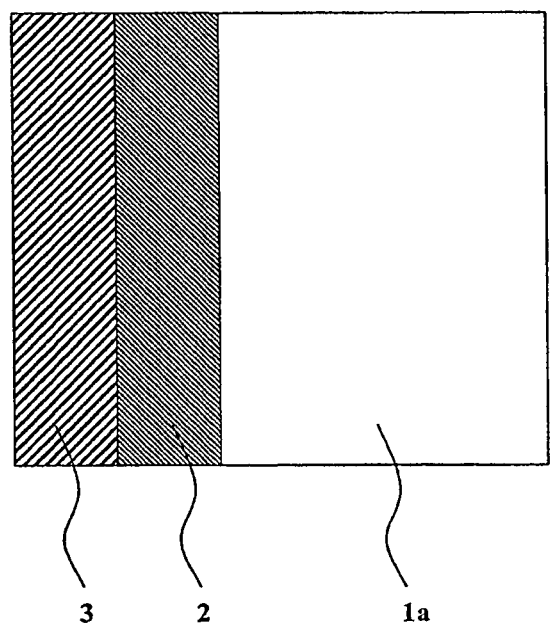

| | | | |
|---|---|---|---|
| 4,855,795 A | | 8/1989 | Yamamoto et al. |
| 5,162,892 A | * | 11/1992 | Hayashi et al. ............... 257/65 |
| 5,378,541 A | | 1/1995 | Ihara et al. |
| 5,439,569 A | * | 8/1995 | Carpio ............................ 134/1.3 |
| 6,159,871 A | * | 12/2000 | Loboda et al. ................ 438/786 |
| 6,618,409 B1 | | 9/2003 | Hu et al. |
| 2004/0081747 A1 | | 4/2004 | Lauinger et al. |

FOREIGN PATENT DOCUMENTS

| | | |
|---|---|---|
| KR | 2003-0079265 A | 10/2003 |
| WO | WO-20051006402 A2 | 1/2005 |

OTHER PUBLICATIONS

Latteman et al., Characterization of silicon carbide and silicon nitride thin films and Si3N4/SiC multilayers, 2002, Diamond and Related Materials, pp. 1248-1253.*

Hezel et al., "Plasma Si nitride-A promising dielectric to achieve high-quality silicon MIS/IL solar cell," J. Appl. Phys. vol. 52, No. 4, Apr. 1981, pp. 3076-3079.

Cavicchi el al., "Large Area Wraparound Cell Development," 1984, pp. 128-133.

Jooss et al., "Back Contact Buried Contact Solar Cells With Metallization Wrap Around Electrodes," T.M. Conference Record of the 28th IEEE Photovoltaic Specialists Conference , pp. 176-179, Sep. 2000, Anchorage, Alaska.

Dauwe et al., 'Very Low Surface Recombination Velocities on p- and n-Type Silicon Wafers Passivated With Hydrogenated Amorphous Silicon Films, pp. 1246-1249.

Bentzen et al., "Surface Passivation of Silicon Solar Cells by Amorphous Silicon/Silicon Nitride Dual Layers," 15th International Photovoltaic Science & Engineering Conference (PVSEC-15), Shanghai China, 2005, pp. 316-317.

Ulyashin et al., "Effective Lifetime of Minority Carriers in Cilicon: The Role of Heat—and Hydrogen Plasma Treatments," Electrochemical Society Prodeedings, vol. 2004-05, pp. 334-345.

Kessels W M M et al., Journal of Vacuum Science and Technology A. Vacuum, Surface and Films, American Institute of Physics, vol. 20, No. 5, Sep. 2002, pp. 1704-1715.

Dauwe S et al., Proceedings of 3rd World Conference on Photovoltaic Energy Conversion (IEEE Cat. No. 03CH37497), vol. 2, 2003, pp. 1395-1395, vol. XP002390268.

Claudio G et al., Amorphous and Heterogeneous Silicon Thin Films, vol. 609, Apr. 24, 2000, pp. A13401-A13406.

Decision of the Examining Division dated Jan. 20, 2011; European Patent Office; EPO Form 2048.2 12.07 TRI; EPO Form 2906 01.91 TRI; pp. 1-9.

* cited by examiner

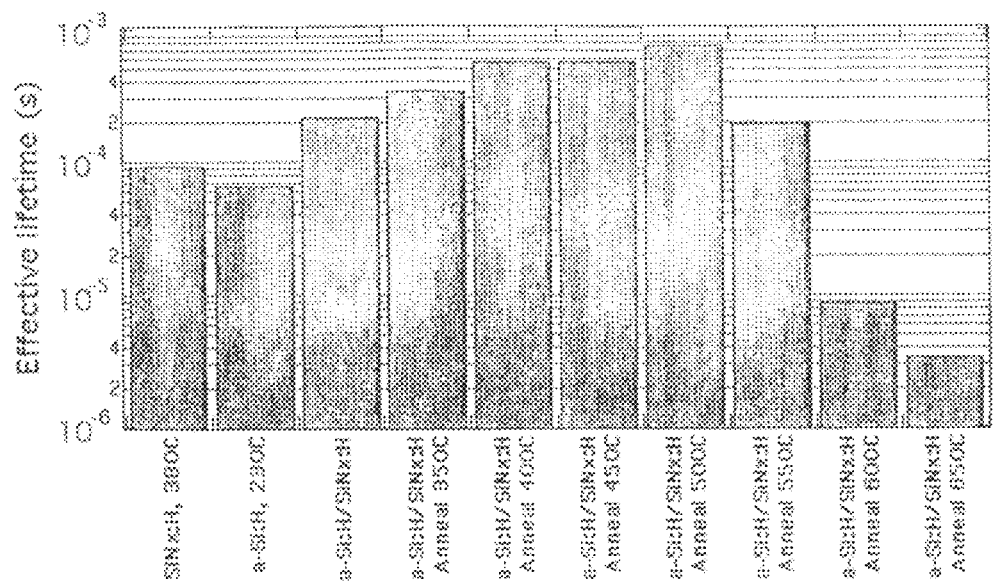
Figure 1a  Facsimile of Fig. 1 of [2]
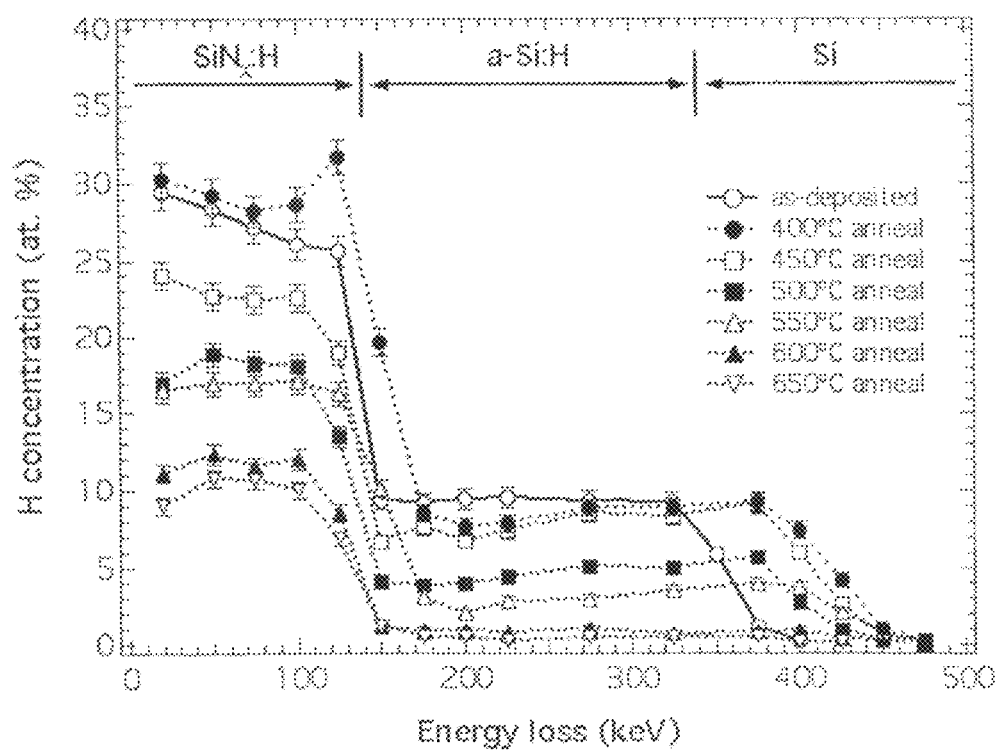
Figure 1b  Facsimile of Fig. 2 of [2]

3     2     1a

SURFACE PASSIVATION OF SILICON BASED WAFERS

This application is the National Phase of PCT/NO2006/000139 filed on Apr. 12, 2006, which claims priority under 35 U.S.C. 119(e) to U.S. Provisional Application No. 60/671,081 filed on Apr. 14, 2005 the entire contents of which are hereby incorporated by reference.

FIELD OF THE INVENTION

This invention relates to reduction of the surface recombination velocity, also described as surface passivation, of silicon semiconductor samples such as silicon wafer based solar cells. The invention allows such surface passivation of very high quality to be obtained at a low manufacturing cost, with simple implementation in existing silicon device manufacturing processes.

BACKGROUND

It is widely known that a bare silicon sample contains a large amount of surface states, at which injected or photogenerated minority carriers can recombine. Thus, for silicon based devices where transport of minority carriers are crucial for efficient operation, such as in silicon based solar cells, reduction of the surface recombination velocity by a surface passivation technique is extremely important.

Most industrially manufactured solar cells are presently consisting of a single crystalline or polycrystalline wafer of one type of conductivity, with a thin diffused layer of the other conductivity present at one surface. Atop this surface, which is exposed to light during operation, a thin hydrogenated silicon nitride film is commonly deposited to obtain some degree of surface passivation (see e.g. R. Hezel et al., Journal of Applied Physics 52, (1981) pp. 3076-3079). This film also acts as an anti-reflection coating to increase the light trapping in the device. Such silicon nitride films can be deposited by, among other techniques, plasma deposition from a source gas mixture of $SiH_4$ and $NH_3$. Contact metallization is then achieved by e.g. screen printing an array of contacts on the light-receiving surface as well as a back contact layer with soldering pads at the reverse surface of the cells, and electrical contacts to the silicon device is obtained by a subsequent firing process. Although the above solar cell structure is successful in achieving decent current conversion efficiencies, it is generally accepted that as the material quality of the silicon wafers increases, better passivation of surface defects is necessary in order to further increase the conversion efficiency of such solar cells.

During the past years, other cell structures that overcome some of the limitations behind the above mentioned structure have been presented. Specifically, reduction in the light shadowing at the front surface has been proposed and verified through collection of both polarity current collection terminals at the reverse surface, i.e. the surface not primarily exposed to light, of the solar cells. Roughly, methods for obtaining such reduced shadowing can be divided in two groups as described in the following. Firstly, the solar cells may incorporate a carrier collecting region on the light-receiving surface, in combination with methods to pass current through or around the substrate to a connection area on the back surface. Current can be passed from a collection grid on the light-receiving surface to the back surface around the edges of the solar cell by incorporation of metallized regions on one or several sides of the cells, often referred to as metallization wrap around (MWA), (see B. T. Cavicchi et al., "Large area wrap around cell development", Proc. 16$^{th}$ European PVSEC, 1984; W. Joos et al., "Back contact buried contact solar cells with metallization wrap around electrodes", Proc. 28$^{th}$ IEEE PVSC, 2000). Alternatively, current can be passed to the back surface through metallized holes (or vias) through the substrate, often referred to as metallization wrap through (MWT) when a current collection grid is present on the light-receiving surface, or emitter wrap through (EWT) when no such collection grid is present, (see U.S. Pat. No. 3,903,42, G. J. Pack; U.S. Pat. No. 5,468,652, J. M. Gee; U.S. Pat. No. 6,384,317B1, E. Van Kerschaver et al.; U.S. Pat. No. 2004/0261840A1, R. M. Schmit et al.; International Pat. No. WO 2005/006402A2, R. M. Schmit et al.). Secondly, there may be no carrier collection region on the light receiving surface, both charge type carriers being collected at current collection contact regions solely at the back surface of the cells (see U.S. Pat. No. 4,395,583, A. Meulenberg; U.S. Pat. No. 4,478,879, C. R. Baraona et al.; U.S. Pat. No. 4,838,952, H. G. Dill et al.; U.S. Pat. No. 4,927,770, R. M. Swanson).

Especially in the latter of the above mentioned techniques, i.e. solar cell structures employing no carrier collection junction at the light receiving surface, efficient surface passivation of the front surface is essential for efficient operation. In addition to surface passivation by deposition of a thin hydrogenated silicon nitride film as described above, another method to achieve efficient surface passivation used both in sensor devices and silicon solar cells is deposition of a thin hydrogenated amorphous silicon layer. Hydrogenated amorphous silicon film can be manufactured by, among other techniques, plasma deposition from a $SiH_4$ precursor gas. In the case of amorphous silicon thin films, a technological barrier is the lack of stability of the surface passivation upon high temperature treatments, limiting subsequent device manufacturing to relatively low temperatures. In particular, for the use of amorphous silicon layers in solar cell devices, the metallization of contacts are restricted to low temperature processes. This complicates device manufacturing, and presents a barrier for implementation of amorphous silicon films as a surface passivation layer in industrial manufacturing of solar cells.

PRIOR ART

South-Korean patent application No. 2002-0018204 discloses depositing a first layer of amorphous silicon with thickness in the range of 1-20 nm, followed by depositing a layer of silicon nitride with refractive index in the range of 1.9-2.3. Both are deposited by PECVD (plasma enhanced chemical vapour deposition) at 300° C. using a mixture of $SiH_4$, $H_2$ for both layers and also $NH_3$ when depositing the silicon nitride layer. This dual layer shows a passivation effect that is higher than the additive effect expected from one single layer of amorphous silicon and one single layer of silicon nitride.

Objective of the Invention

The main objective of the invention is to provide a method for obtaining an excellent surface passivation of silicon based semiconductor wafers.

An object of the claimed invention is to provide methods for achieving highly efficient surface passivation of silicon wafer based solar cells that are easily introduced in existing silicon device manufacturing processes, without imposing severe limits on subsequent processing steps.

A further objective is to provide novel silicon based solar cells with excellent surface passivation based on depositing a first layer of amorphous silicon and a second layer of silicon nitride.

LIST OF FIGURES

FIG. 1a) shows measured effective recombination lifetime of high quality silicon samples treated with different surface passivation techniques, compared with results obtained after annealing of an amorphous silicon/silicon nitride stack, in accordance with the present invention, and FIG. 1b) shows measured hydrogen distributions in the passivation layers and surface region of the silicon wafer for the samples presented in FIG. 1a).

FIG. 2a) illustrates one embodiment of the claimed invention, where a silicon surface is passivated by a thin amorphous silicon or amorphous silicon carbide layer combined with a thin silicon nitride layer.

Figure 2B:
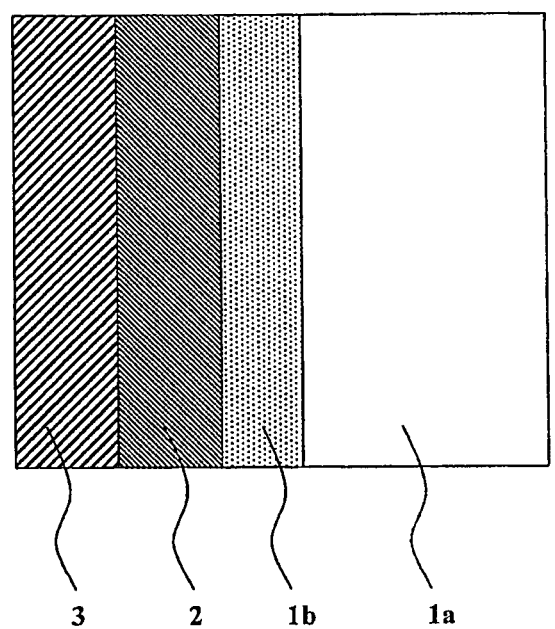

FIG. 2b) illustrates another embodiment of the invention, where the surface of the silicon sample underlying the passivation structure is doped substantially different from the rest of the silicon sample.

Figure 3A:
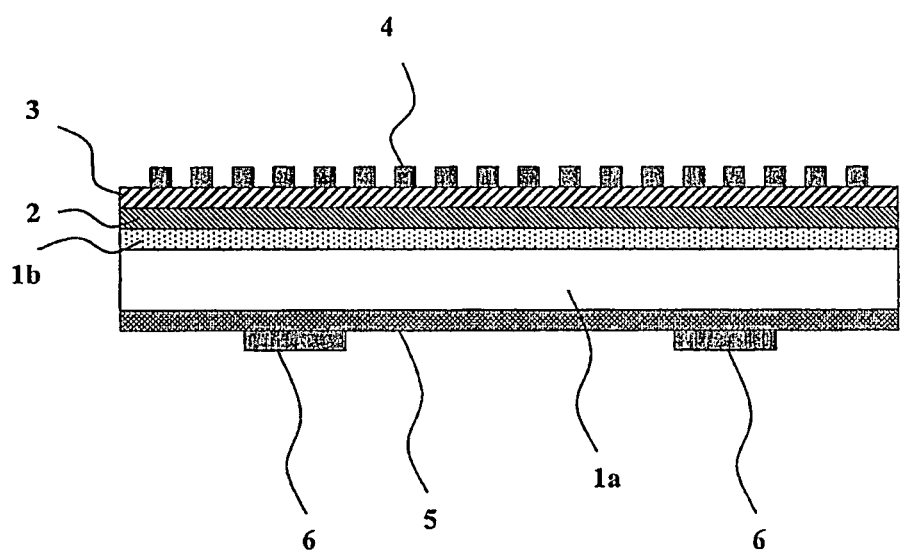

FIG. 3a) illustrates a method for fabrication of a solar cell employing the invention, where the claimed method for achieving front surface passivation is introduced in a conventional silicon solar cell structure.

Figure 3B:
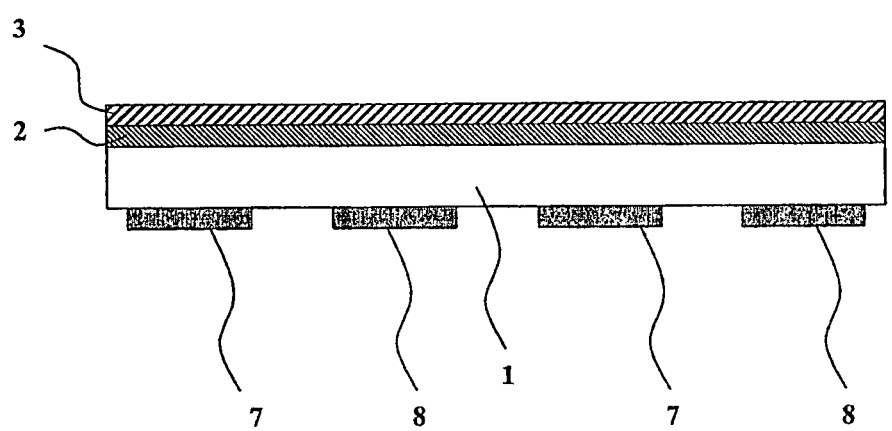

FIG. 3b) illustrates another method for fabrication of a solar cell employing the invention, in which the claimed method for achieving front surface passivation is introduced in a back-contacted solar cell structure.

DESCRIPTION OF THE INVENTION

The objectives of the invention may be obtained by the features set forth in the following description of the invention and/or in the appended claims.

The invention is based on the discovery that the dual passivation layer disclosed in South-Korean patent application No. 2002-0018204 may be given a substantially increased passivation effect by performing a gentle annealing after deposition of the layers. By gentle annealing, we mean an annealing at a temperature below the temperatures where the deposited passivation films are known to degrade. For example, the passivation effect is reported to be non-reversible degraded at 300-350° C. in the case of using silicon nitride films, at less than 400° C. for amorphous silicon films, and at >500° C. for combined amorphous silicon and silicon nitride films.

Thus the present invention relates to a method for obtaining an efficient surface passivation in single crystalline or poly-crystalline (including multi-crystalline) silicon wafer based solar cells where a first hydrogenated amorphous silicon or hydrogenated amorphous silicon carbide thin film of thickness in the range of 1-150 nm is deposited on the silicon wafer, followed by depositing a hydrogenated silicon nitride thin film of thickness in the range of 10-200 nm atop the amorphous silicon or amorphous silicon carbon layer. Preferably, but not limited to, the amorphous silicon or silicon carbide and silicon nitride films are deposited by plasma enhanced chemical vapor deposition (PECVD). The two films are preferably deposited in a substantially single deposition process. Examples of further preferred methods for deposition of the one or more passivation layer(s) include, but are not limited to; plasma enhanced chemical vapour deposition, low temperature chemical vapour deposition, low pressure chemical vapour deposition, or sputtering.

After deposition of the passivation films, the surface passivated wafer is annealed at a temperature in the range from about 300 to 600° C. Further, the present invention also relates to solar panels made by wafers passivated according to the method described above.

The increase of the passivation effect by the annealing at temperatures up to 600° C. is a surprising feature, since it is generally known that the passivation effect of amorphous silicon films severely degrades non-reversibly after being heated to temperatures above 300-350° C.; see for instance [1]. Thus it is generally assumed that use of amorphous silicon as surface passivation means that low temperature metallization steps (below 300-350° C.) are required in the subsequent process steps in order to preserve the surface passivation. However, the present inventors have shown that this is not a general feature, and have thus made it possible to employ amorphous silicon films as surface passivation at higher temperatures. And have thus, due to the higher temperature stability of the dual surface passivation layer compared to e.g. solely an amorphous silicon layer, allowed using this film without loss of passivation effect for both back-contacted solar cell structures and more traditional solar cell structures.

Studies performed by the present inventors show that the increased passivation effect is probably due to diffusion of hydrogen atoms into the boundary region of the crystalline silicon substrate. Without being bound by theory, it is believed that these hydrogen atoms satisfies dangling bonds in the crystalline silicon and thus passivates the surface region of the silicon wafer. These studies are presented in an article by the present inventors [2]. FIG. 1 if [2] shows measurements of the effective recombination times using the quasi-steady-state photo-conductance technique. The figure shows that the passivation effect increases by increasing annealing temperature up to about 500° C., and then decreases rapidly with increasing temperature. Thus there is an optimum annealing temperature of about 500° C. FIG. 2 of [2] shows measured distributions of hydrogen by use of nuclear reaction analyses of the dual passivation layer and the surface region of the silicon wafer at the different annealing temperatures. The figure shows that the measured hydrogen concentrations has a maximum at 500° C. annealing temperature of about 10 atom % H in the surface region of the wafer. Annealing at higher or lower temperatures gives lesser hydrogen contents. A facsimile of FIG. 1 and FIG. 2 of [2] is given in this application as FIGS. 1a) and b), respectively.

Thus the claimed invention also includes silicon based wafers passivated by methods resulting in an in-diffusion of hydrogen in the surface region of the wafer, and solar cells made from such wafers. The basis for this is found in the priority application U.S. 60/671,081 filed on 14 Apr. 2005, which discloses the inventive method of annealing the dual layer described above.

PREFERRED EMBODIMENTS OF THE INVENTION

The invention will be described in more detail in the form of preferred embodiments, which by no means should be considered a limitation of the inventive idea of employing passivation films that result in an in-diffusion of hydrogen atoms into the surface region of silicon wafers when subject to a gentle annealing. The preferred embodiments of the solar panels are based on silicon wafers which may be made from a mono-crystalline silicon, poly-silicon, or multi-crystalline silicon block. Also, the principle of the invention relates equally well to any silicon based device which is dependent on efficient transport of minority carriers through portions of the device.

First Preferred Embodiment of the Invention

The first preferred embodiment of the invention is a method for passivating a silicon wafer.

The preferred method for depositing the dual passivation layer is as follows: The wafer (1a, 1b) is cleaned by immersion in a $H_2SO_4:H_2O_2$ solution followed by an oxide removal in diluted HF. Then the wafer is introduced into a plasma enhanced chemical vapour deposition chamber (PECVD-chamber), and an amorphous silicon film with thickness 1-150 nm, preferably about 10-100 nm is deposited by use of $SiH_4$ as sole precursor gas. Then a layer of silicon nitride is deposited by use of a mixture of $SiH_4$ and $NH_3$ as precursor gases in the PECVD-chamber. The thickness of the silicon nitride film should be in the range of 10-200 nm, preferably about 70-100 nm. The deposition temperature in the PECVD-chamber is about 250° C. for both films. The passivation procedures is finalised by heating the wafers to a temperature in the range of 350-550° C., preferably around 500° C. for a short period, preferably about four minutes. The precursor gases may comprise from 0 to about 50 mol % hydrogen gas.

The investigations made by the inventors on monocrystalline silicon wafers is summarised in FIGS. 1a) and 1b). FIG. 1a) is a summary of results of effective minority carrier recombination lifetime, as measured at an injection level of $1\times10^{15}$ cm$^{-3}$ using the quasi-steady-state photoconductance technique (For a presentation of the measuring technique, see for example R. A. Sinton et al., Applied Physics Letters 69, (1996) pp. 2510-2512). The samples measured were p-type silicon samples manufactured by the Czochralski process, which received surface passivation layers at both sides of the sample. The layers were deposited as given above. The need for deposition of layers at both surfaces of the samples for efficient measurements is apparent to all those skilled in the field, and should thus not be considered as a limitation of the invention.

It is apparent from the data in FIG. 1a) that independent layers of both a hydrogenated silicon nitride film (thickness 80 nm) and a hydrogenated amorphous silicon film (thickness 100 nm) individually exhibit some degree of surface passivation of the underlying silicon sample, with measured effective recombination lifetimes in the range of 50-100 µs. Interestingly, though, the deposition a dual surface passivation layer consisting of a first hydrogenated amorphous silicon film (thickness 100 nm) followed by an overlying hydrogenated silicon nitride film (thickness 80 nm), both films deposited at a temperature of 250° C., reveals a measured effective lifetime of about 220 µs, that is 2-3 times higher than the single films alone. However, the dual passivation film annealed at 500° C. shows an efficient recombination of about 780 µs, almost one order of magnitude higher than the individual layers alone and about 3 times as efficient as the dual layer with no annealing. As previously mentioned, the poor temperature stability of amorphous silicon films sets a strict restriction of possible conditions during the process steps following the surface passivation of silicon wafers. In the case of a combined amorphous silicon/silicon nitride structure, however, it is readily seen from FIG. 1a) that the surface passivation is stable up to at least 500° C. In addition to the increased temperature stability, the figure shows the surprising result that the surface passivation even improves after subsequent annealing. Further, upon annealing at temperatures above 500° C., the surface passivation will degrade, thus there exists a temperature window for subsequent thermal treatments in order to retain the passivation properties of the structure.

FIG. 1b) shows hydrogen distributions in the dual passivation layers (2, 3) and the surface region of the wafer (1a) measured by nuclear reaction analyses. The measurements are performed on the same samples presented in FIG. 1a), and it may be seen that there is a correlation between the hydrogen concentration at the surface region of the silicon wafer (1a) and the obtained effective recombination times. That is, the effective recombination times is related to the hydrogen concentration in the surface region of the silicon wafer, and that the hydrogen concentration at the surface region of the silicon wafer in the sample with the best obtained recombination times (the dual passivation layer annealed at 500° C.) is about 10 atom %. Thus it is believed that the reason for the markedly increased passivation effect of the annealing according to the inventive method is due to diffusion of hydrogen atoms into the boundary region of the crystalline silicon substrate which satisfies dangling bonds in the crystalline silicon. It should be noted that annealing at higher or lower temperatures gives lesser hydrogen contents in the surface region of the silicon wafer, and corresponding lower effective recombination times.

The measurements presented in FIGS. 1a) and 1b) is taken from an article presented after the priority date of this application. The claimed invention does nevertheless contain silicon wafers/solar panels where the surface region is passivated by a dual layer film which is annealed such that the surface region of the wafer is more or less saturated with hydrogen atoms. It should be noted that the priority document discloses all features of the inventive method of surface passivating silicon wafers, such that the hydrogen content is only a discovery explaining why the inventive method has an unexpected passivation effect.

The investigations has indicated that the best mode of the invention is silicon wafers passivated with a first layer of about 10-100 nm thick amorphous silicon film (2) followed by a second layer of about 70-100 nm thick silicon nitride film (3), which is heated to about 500° C. for four minutes after deposition. Even though the investigations are performed on a monocrystalline silicon wafer, the best mode includes wafers of polycrystalline and multicrystalline silicon passivated with the dual film defined above.

Second Preferred Embodiment of the Invention

The second preferred embodiment of the invention is a silicon wafer passivated at least on one side with the layers deposited by the method according to the first preferred embodiment.

FIG. 2a) is a cross sectional view from the side of a preferred embodiment of the invention, where a silicon sample (1a) of either n- or p-type conductivity receives a deposition of a layer 2 of intrinsic hydrogenated amorphous silicon or hydrogenated amorphous silicon carbide of thickness in the range 1-150 nm. Atop layer (2) is deposited a hydrogenated silicon nitride thin film (3) of thickness 10-200 nm. The complete structure can then optionally be annealed to optimize the surface passivation at a suitable temperature preferably in the range 300-600° C.

FIG. 2b) is a cross sectional view from the side of the second preferred embodiment of the invention, where a silicon sample of one type conductivity (n- or p-type) (1a) has a layer of silicon with either the same or the opposite type conductivity (1b) of substantially higher conductivity compared to the silicon region (1a). Typically, but not limited to, the concentration of dopant (acceptor- or donor-type) in silicon layer (1b) is 3-5 orders of magnitude higher than in the silicon region (1a). The higher conductivity layer (1b) can be fabricated by in-diffusion or ion implantation of a suitable dopant into layer (1a), or by deposition of a appropriately silicon layer by a large range of various deposition techniques. Atop the higher conductivity silicon region (1b) is deposited an intrinsic hydrogenated amorphous silicon or hydrogenated amorphous silicon carbide film (2) of thickness 1-150 nm. Atop layer (2) is deposited a hydrogenated silicon nitride thin film (3) of thickness 10-200 nm. The complete structure can then optionally be annealed to optimize the surface passivation at a suitable temperature preferably in the range 300-600° C.

The best mode of the second preferred embodiment is either a mono-crystalline, poly-crystalline, or multi-crystalline silicon wafer (1a) of one type of conductivity (n- or p-type) with a dual passivation layer of one amorphous silicon film (2) and one silicon nitride film (3), and at least one diffused layer (1b) with the other type of conductivity (p- or n-type) of the wafer also with a dual passivation layer of one amorphous silicon film (2) and one silicon nitride film (3). The passivation layer should preferably be deposited on both sides, but may only be deposited only on one side of the wafer (1a, 1b). The layers in the best mode of the invention is the same as given in the first preferred embodiment of the invention; about 10-100 nm thick amorphous silicon film (2) followed by a second layer of about 70-100 nm thick silicon nitride film (3), which is heated to about 500° C. for four minutes after deposition.

Third Preferred Embodiment of the Invention

The third preferred embodiment of the invention is a solar cell passivated with the method according to the first preferred embodiment.

FIG. 3a) shows a cross-sectional view from the side of a preferred embodiment of a solar cell according to the invention. The figure shows a silicon wafer (1a) of monocrystalline or polycrystalline (including multi-crystalline) nature of one type conductivity (n- or p-type) including a silicon layer (1b) of the other type conductivity, processed by e.g. in-diffusion of a suitable dopant into the silicon wafer (1a). Atop the silicon layer (1b) is deposited an intrinsic hydrogenated amorphous silicon or hydrogenated amorphous silicon carbide film (3) of thickness 1-150 nm. Atop layer (2) is deposited a hydrogenated silicon nitride thin film (3) of thickness 10-200 nm. A current collection grid (4) for the one polarity carrier is then deposited on top of the silicon nitride film (3). On the back-side surface is deposited a current collection region (5) for the other polarity carrier, as well as soldering pads (6) for interconnection of individual solar cells in a module. Methods for forming the contact regions (4, 6, and 6) include, but are not limited to, screen-printing metal containing pastes or evaporation of appropriate metals. The complete structure is then heated for combined contact firing and annealing of the surface passivation stack consisting of layers (2 and 3). The temperature for combined contact firing and passivation optimization is preferably in the range of 300-600° C.

The best mode of the third preferred embodiment employs the same surface passivation as the best mode of the second preferred embodiment on both sides of the silicon wafer, which may be either a mono-crystalline, poly-crystalline, or multi-crystalline silicon wafer (1a) of one type of conductivity (n- or p-type) with at least one diffused layer (1b) with the other type of conductivity (p- or n-type), and where the passivation layers is a first layer of about 10-100 nm thick amorphous silicon film (2) followed by a second layer of about 70-100 nm thick silicon nitride film (3), which is heated to about 500° C. for four minutes after deposition.

Fourth Preferred Embodiment of the Invention

The fourth preferred embodiment is a second aspect of a preferred solar cell passivated with the method according to the first preferred embodiment.

This preferred embodiment is an example where the passivation is only applied on the front side of the silicon wafer, and is illustrated in FIG. 3b) which shows a cross-sectional view from the side. The figure shows a silicon based solar cell (1) having both polarity current collection terminals (7) and (8) on the same surface of the cell. Such a back-contact solar cell may consist of, but not limited to, an emitter wrap through cell or a metal wrap through cell having a current collection regions on the light-receiving surface combined with a method for passing the collected carriers to the opposite surface, or a back-contacted cell in which no such carrier collection region is present at the light-receiving surface. Atop the light-receiving surface of the silicon solar cell (1) is deposited an intrinsic hydrogenated amorphous silicon or hydrogenated amorphous silicon carbide film (2) of thickness 1-150 nm. Atop layer (2) is deposited a hydrogenated silicon nitride thin film (3) of thickness 10-200 nm. The complete structure can then optionally be annealed to optimize the surface passivation at a suitable temperature preferably in the range 300-600° C.

The best mode of the fourth preferred embodiment employs the same surface passivation as the best mode of the second preferred embodiment, but now only on the front side of the silicon wafer, which may be either a mono-crystalline, poly-crystalline, or multi-crystalline silicon wafer (1a) of one type of conductivity (n- or p-type) with at least one diffused layer (1b) with the other type of conductivity (p- or n-type), and where the passivation layers is a first layer of about 10-100 nm thick amorphous silicon film (2) followed by a second layer of about 70-100 nm thick silicon nitride film (3), which is heated to about 500° C. for four minutes after deposition. The diffused layer (1b) is not shown in the figure.

While preferred embodiments of the invention have been described, it is understood that various modifications to the disclosed processes and methods may be made without departing from the underlying spirit of the invention or the scope of the subsequent claims.

REFERENCES

1. S. Dauwe, J. Schmidt, and R. Hezel, *Proc. 29$^{th}$ IEEE PVSC*, 2002, 1246-1249.
2. Andreas Bentzen et al. "Surface Passivation of Silicon Solar Cells by Amorphous Silicon/Silicon Nitride Dual Layers", presented at 15$^{th}$ International Photovoltaic Science & Engineering Conference (PVSEC-15), Shanghai, China, 19$^{th}$ May 2005.

The invention claimed is:
1. A method for surface passivation of silicon based semiconductors, wherein the method comprises:
cleaning the surface of the semiconductor that is to be passivated,
removing an oxide layer on the surface of the semiconductor that is to be passivated,
introducing the cleaned surface of the semiconductor into a plasma enhanced chemical vapor deposition chamber, depositing a 10-100 nm thick amorphous silicon passivation layer directly on the surface of the semiconductor that is to be passivated by use of $SiH_4$ as a precursor gas at about 250° C., depositing a 70-100 nm thick silicon nitride passivation layer on top of the deposited amorphous silicon passivation layer by use of a mixture of $SiH_4$ and $NH_3$ as precursor gases at about 250° C., and finally annealing the wafer with the deposited passivation layers at a temperature of about 500° C. for four minutes.

2. The method according to claim 1, wherein
the cleaning of the surface of the semiconductor is obtained by immersion in a $H_2SO_4$:$H_2O_2$ solution, and
the removal of the oxide layer is obtained by immersion in diluted HF.

3. The method according to claim 1, wherein
the precursor gases used for plasma enhanced chemical vapor deposition of either the amorphous silicon layer, the silicon nitride layer, or both layers, also contain hydrogen gas.

4. The method according to claim 1, wherein
the amorphous silicon passivation layer is a silicon carbide film.

5. A surface passivated silicon wafer comprising:
a silicon semiconductor wafer of one type of conductivity (p- or n-type) having at least one thin diffused layer of the other type conductivity (n- or p-type),
a deposited surface passivation dual layer directly on at least a first (light receiving side) surface of the wafer, the deposited surface passivation dual layer being made of a first layer of a 10-100 nm thick amorphous silicon film on the wafer, and a second layer of a 70-100 nm thick silicon nitride film on the first layer, and
wherein the wafer and the deposited dual layer is annealed at a temperature of about 500° C. for four minutes such that the first surface of the silicon wafer is at least partially saturated by in-diffusion of hydrogen atoms and contains about 10 atom % hydrogen.

6. The surface passivated silicon wafer according to claim 5,
wherein
the first layer is a silicon carbide film.

7. A solar cell comprising:
a silicon semiconductor wafer of one type of conductivity (p- or n-type) having at least one thin diffused layer of the other type conductivity (n- or p-type),
a deposited surface passivation dual layer directly on both a first surface (light receiving side) and a second surface (backside) of the silicon wafer, the deposited surface passivation dual layer being made of a first layer of a 10-100 nm thick amorphous silicon film on the wafer, and a second layer of a 70-100 nm thick silicon nitride film on the first layer,
a current collection grid for the one type of conductivity deposited on top of the surface passivation dual layer on the first surface of the wafer,
a current collection grid for the other type conductivity deposited on top of the surface passivation dual layer on the second surface of the wafer,
soldering pads for interconnection of a plurality of solar cells into a module,
wherein the wafer and the deposited dual layer is annealed at a temperature of about 500° C. for four minutes such that the first surface of the silicon wafer is at least partially saturated by in-diffusion of hydrogen atoms and contains about 10 atom % hydrogen.

8. The solar cell according to claim 7,
wherein the first layer is a silicon carbide film.

9. A solar cell comprising:
a silicon semiconductor wafer of one type of conductivity (p- or n-type) having at least one thin diffused layer of the other type conductivity (n- or p-type),
a deposited surface passivation dual layer directly on both a first surface (light receiving side) and a second surface (backside) of the silicon wafer, the deposited surface passivation dual layer being made of a first layer of a 10-100 nm thick amorphous silicon film on the wafer, and a second layer of a 70-100 nm thick silicon nitride film on the first layer,
a current collection grid for the one type of conductivity and a current collection grid for the other type conductivity deposited on the second surface of the wafer,
wherein the wafer and the deposited dual layer is annealed at a temperature of about 500° C. for four minutes such that the first surface of the silicon wafer is at least partially saturated by in-diffusion of hydrogen atoms and contains about 10 atom % hydrogen.

10. The solar cell according to claim 9,
wherein the first layer is a silicon carbide film.

* * * * *